United States Patent
Javan

[11] 3,947,630
[45] Mar. 30, 1976

[54] IMAGING DEVICES
[75] Inventor: Ali Javan, Cambridge, Mass.
[73] Assignee: Massachusetts Institute of Technology, Cambridge, Mass.
[22] Filed: Dec. 19, 1974
[21] Appl. No.: 534,157

Related U.S. Application Data
[60] Division of Ser. No. 389,783, Aug. 20, 1973, which is a continuation-in-part of Ser. No. 62,380, Aug. 10, 1970, Pat. No. 3,755,678.

[52] U.S. Cl................ 178/7.1; 250/211 J; 250/578; 350/3.5; 325/342; 178/7.2
[51] Int. Cl.² ........................................... H04N 3/16
[58] Field of Search............ 250/211 R, 211 J, 212, 250/552, 553, 578; 357/17, 18, 30, 31; 324/79 R; 331/DIG. 1, 83; 178/7.1, 7.2; 350/3.5; 325/311, 342

[56] References Cited
UNITED STATES PATENTS

| | | | |
|---|---|---|---|
| 3,229,106 | 1/1966 | De Lord et al. | 250/211 J X |
| 3,462,605 | 8/1969 | Engeler | 250/211 J |
| 3,576,392 | 4/1971 | Hofstein | 178/7.1 |
| 3,649,838 | 3/1972 | Phelan, Jr. | 250/211 J |
| 3,868,658 | 2/1975 | Kiemle | 350/3.5 X |

OTHER PUBLICATIONS
Dees: The Microwave Journal; Vol. 9, Sept., 1966; pp. 48–55.
Hocker et al.: Applied Physics Letters; Vol. 12, No. 12; June 15, 1968; pp. 401, 402.

*Primary Examiner*—Walter Stolwein
*Attorney, Agent, or Firm*—Arthur A. Smith, Jr.; Martin M. Santa; John N. Williams

[57] ABSTRACT

Optical diodes are shown in the forms of a mechanically contacted cat whisker system and as single and multiple microscopic solid portions in an integrated solid mass, defining both the antenna and the junction, preferably as a deposit of solid layers upon a substrate, preferably as overlapping printed circuit line structures. Arrays of such junctions provide enhanced effects.

In a scanner, read-out from the junctions is shown indirectly, using an electron beam, and directly using leads connected to respective antennae. Local oscillators directing radiation upon an image disecting array, mixing in the junctions with incident radiation from the image create superheterodyne beats leading to improved levels of detection. By phase locking the local oscillator to the frequency of coherent image-illuminating radiation, and detecting phase of the beats relative to the illuminating radiation, as well as amplitude, a holographic display of the image is achieved.

7 Claims, 15 Drawing Figures

IMAGING DEVICES

CROSS REFERENCE TO RELATED APPLICATIONS

This is a division of application Ser. No. 389,783 filed Aug. 20, 1973 which in turn is a continuation-in-part of application Ser. No. 62,380 filed Aug. 10, 1970 and issued as U.S. Pat. No. 3,755,678.

BACKGROUND OF THE INVENTION

This invention relates to generating and detecting radiation, especially optical radiation with wavelength lying in the far infrared, infrared, visible, or intermediate regions of the spectrum.

SUMMARY OF THE INVENTION

The invention features a diode of integrated solid construction comprising successive metal deposits having a limited, i.e., microscopic, common area at which the deposits are separated by a thin dielectric layer, preferably sufficiently thin to allow electron tunneling and preferably the diode or a succession of them being achieved by microscopic line structures overlapping at their tips, the line structure serving as antennae for receiving incident optical radiation to produce an electrical effect.

A dense array of the devices is featured to resolve an image for scanning and holographic purposes.

Further features and advantages of the invention will appear from the following description of preferred embodiments thereof taken in conjunction with the accompanying drawings.

BRIEF DESCRIPTION OF THE DRAWINGS

FIG. 11 gives a symbolic representation of a diode device used in other views herein;

According to the invention a solid integrated structure capable of generating wave lengths down to 10 microns or shorter (or detecting same) is realizable providing the necessary non-linear junction in the form of a dielectric layer or layers interposed between fixed conductors. Such non-linear junctions realize advantages of vibration-resistant stability, compact packing and ruggedness, permitting use in the field. (These junctions are for convenience referred to herein as "diodes" although use of more than two conductor layers and several dielectric layers to form a junction configuration such as triodes, etc., are to be understood included.)

In the presently preferred form this solid diode comprises a deposit of solid layers upon a substrate, manufactured in accordance with generally known microelectronic methods, and preferably presented together with other such diodes in a predetermined array, such as one of the preferred arrays described below. For constructing diodes operable in the 10 micron range, the techniques of photolithography, e.g., as described in Smith, Bachner and Efremow, Journal of Electrochemical Society: Electrochemical Technology, May 1971, Vol. 118, No. 5 are applicable, in which deposited lines to an accuracy of less than 1 micron are realizable. Alternatively, and of particular utility for shorter wave lengths, one may employ the methods of electron beam microfabrication such as are described in "Microcircuits by Electron Beam", Broers and Hatzaki, Scientific American, November, 1972.

Figure 1:
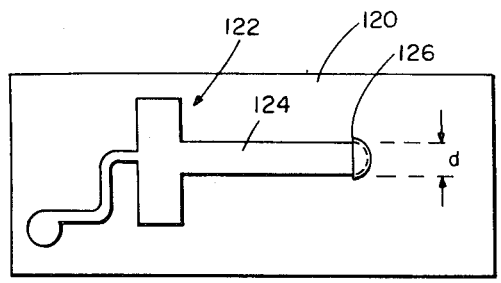
FIG. 1 is a highly magnified diagrammatic plan view of a solid state device according to the invention at a first stage of manufacture.

Referring to FIG. 1 the first step in forming a single diode according to this aspect of the invention is to deposit upon a substrate 120 (preferably transparent to the radiation of interest, e.g. silicon or aluminum oxide for infrared radiation) a conductive line structure 122 including antenna leg 124 of tungsten (or in other instances copper, nickel or other appropriate conductive material). The antenna leg 124 has a width $d$ of the order of 1 micron. According to the next step, the metal of this line structure or at least the tip of leg 124 for the point contact region is allowed to oxidize, forming what will become a potential barrier consisting of a dielectric layer 126 of a few angstrom (of the order of 1 nm) thickness. Then, referring to FIGS. 2 and 3 in a third step a thin metal layer 128, in this embodiment nickel, is deposited on the substrate beyond line structure 122, with a controlled thickness $c$ less than 1 micron and slightly overlapping the top of leg 124 in region E, a distance $t$ kept small, less than 1 micron. The smallness of overlap $t$ and the narrowness $d$ of the tip of leg 124 cooperate to keep the overlap area, hence the capacitance of the contact, very low, e.g. the RC time constant of the resultant structure permitting response to radiation of wave length on the order of 10 microns, or exhibiting an RC time constant as short as $10^{-15}$ sec. (For use at larger wave lengths, e.g. for the far infrared region or where many diodes are employed in array, tolerances are progressively not as critical. It is also possible, in case of the RC time constant being longer than the period of an optical cycle, to operate in the "roll off" region. In this case a useful response can still be obtained even though the speed of the junction is somewhat slower than the frequency of the radiation. For instance for a junction area on the order of 1 micron diameter and with a series resistance arising from an antenna with an impedance of about 50 (ohm), depending upon the thickness of the dielectric layer of say 8°A the speed of response can be about $10^{12}$ Hz. Such a junction however still will respond to radiation of $10\mu$. wave length. In this case however, the device will operate at a roll off point which is down by a factor of 30 from response at $10^{12}$ Hz which corresponds to $300\mu$. Thereafter, a protective layer of dielectric transparent to the wave length of interest may be applied over the entire structure, as suggested in the dashed lines 129 of FIG. 3.

Figure 2:
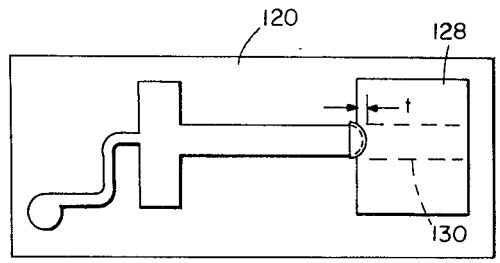
FIG. 2 is a similar view of the completed device of FIG. 1
Figure 3:
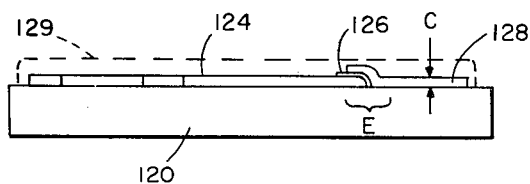
FIG. 3 is a diagrammatic side view of the embodiment of FIG. 2.

For the purpose of producing a second antenna for the diode, layer 128 may be made narrow as suggested by dashed lines 130 in FIG. 2, e.g., with a width $d$, or somewhat wiper for ease of fabrication in aligning the first and second deposits for overlap.

As an alternative to the oxidizing step just mentioned, a controlled layer of dielectric material of selected barrier potential for the particular conditions of interest can be deposited. In such case, after the first step of depositing the antenna 124, this structure or its tip is cleaned of any oxide layer (e.g., by ion bombardment or electron beam cleaning in vacuum). Then a low vapor pressure of the selected dielectric can be introduced to provide a thin layer of controlled thickness of a few angstroms over the tip or the whole conductor and substrate. Afterward, while still operating in vacuum, the third step of depositing layer 128 can be accomplished.

Figure 4:
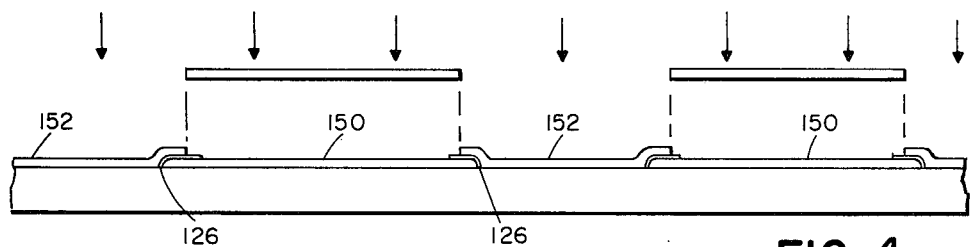
FIG. 4 is a diagrammatic side view similar to FIG. 3 of an array of series-connected devices similar to the individual device of FIG. 3
Figure 5:
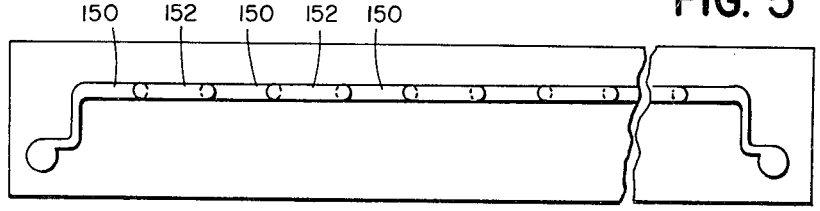
FIG. 5 is a diagrammatic plan view thereof.

Referring to FIGS. 4 and 5, a series array of solid diodes as just mentioned is comprised of first and second metal antenna line-structure deposits 150 and 152 of different metals such as tungsten and nickel, deposited by the techniques mentioned above with a dielectric layer interposed in the contact regions of interest. Layers 150 are first deposited in spaced-apart relation and then, after provision of the dielectric layer, layers 152 are deposited each between and overlapping the ends of a pair of layers 150. To enable effective coupling the length of each line segment is an odd integer multiple of $\lambda/4$ where $\lambda$ is the wave length of the highest frequency of interest or longer than the $V_e$ attenuation length characteristic of the antenna or is non resonant and much less in length than the wave length. This construction allows coupling of the incident rays simultaneously with several diodes and as well permits radiation to be generated simultaneously by several diodes.

In certain instances where radiation from the diodes is concerned (as well as in the detection or utilization of electric signals induced in the antenna by incident radiation) special arrangements are provided to prevent cancellation of radiation in a given direction (or of rectified voltages) from various diodes in the series.

Figure 6:
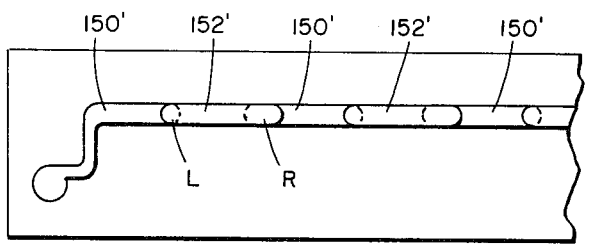
FIG. 6 is a plan view similar to FIG. 5 and FIG. 7 a side view similar to FIG. 3 of a series-connected array with differing connections between antennas for avoiding cancellation effects.

Referring to FIG. 6 lines 150' of tungsten and subsequent lines 152' of nickel are deposited as above however the amount of overlap of each line structure 152' is different at its two ends. At the left end L the extent of overlap is very limited, in accordance with the preceding embodiments to less than 1 micron to provide an R C time constant that enables response at the highest frequency of interest. However at the right end R of each line 150' the extent of overlap is grossly larger, e.g., several microns, and non-responsive. Response to the frequencies of interest and mixing them occurs at the ends L but not at ends R, hence no cancellation results. (If the two successive overlaps were of the same length, due to the reversal of the dissimilar metals, opposite rectification of voltages would occur at the two ends with resultant cancellation.)

Figure 7:
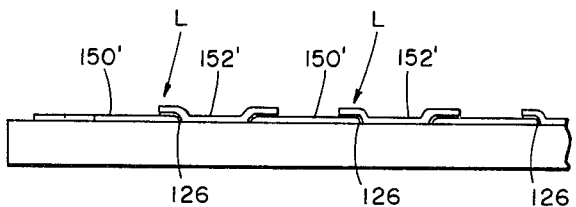

In the alternative embodiment of FIG. 7, the overlap of the second deposits 152 at the two ends are identical in extent. However by means of masking or otherwise during application of the dielectric, the dielectric layers 126 are provided only at the left ends L of lines 152. Thus only at those ends are the effective diodes created, the contact between the right ends of lines 152 and the adjoining lines 150 being ohmic and not capable of producing any rectified voltage or mixing.

With regard to the solid diodes here described, the dielectric substance for layers 126 is chosen to have a nondiffusing characteristic with respect to the metals which it contacts under operating conditions. Tungsten oxide meets this requirement even in operating conditions at room temperature. In other instances working conditions are chosen at cryogenic temperatures, e.g., at temperature of liquid helium in order to avoid disruptive diffusion. By selectively depositing the dielectric layer, as by deposit in vacuum, the barrier potential of the layer material may be controlled by selection of the material, its geometry (especially size) controlled by masking and its thickness controlled by vapor density and duration, all to optimize the particular response being sought.

The construction and theory of operation of such diodes is further discussed in my co-pending application Ser. No. 389,783, the disclosure of which is hereby incorporated by reference.

Going beyond the fabrication of the diodes as printed circuits as just described, the various highly accurate microelectronic techniques are also used, according to the invention to realize printed matched diodes and arrays thereof for parametric generation and detection of electromagnetic radiation in the far-infrared, infrared and visible regions.

According to the present invention it is realized that the well-known principles of coupling radio-frequency radiation to free space are applicable, with appropriate miniaturized dimensions, to the antenna of these infrared and visible radiation generating and detecting devices here described, it being possible by available microelectronic techniques to manufacture a diode whose antenna is optimally matched to free space according to those principles, or to construct a phased array thereof, to achieve entirely new optical effects. First the diodes as radiation generators will be discussed.

Figure 8:
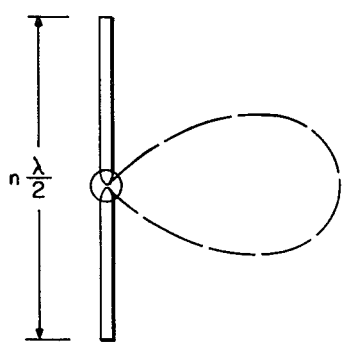
FIGS. 8, 9 and 10 illustrate various antenna lobes associated with respective antennas.
Figure 10:
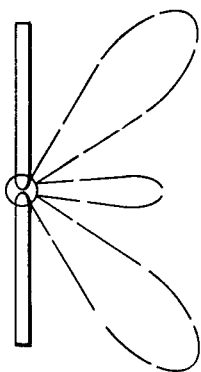
Figure 9:
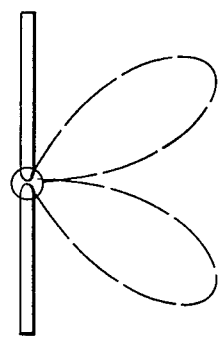

Referring to FIGS. 8–9, good coupling with free space is obtained by employing for an infrared radiation of wave length $\lambda$, a straight antenna of length $n\lambda/2$ where $n$ is an integer smaller than about 10, so that the antenna is no more than a few wave lengths long. FIGS. 8, 9 and 17b illustrate the antenna lobes produced when the selected value of $n$ is 1, 2 and 3 respectively; in the case of 10.6 $\mu$ radiation the overall length of the antennas are 5 $\mu$, 10 $\mu$ and 15 $\mu$. As $n$ increases the principal lobes of the infrared radiation turn toward the axis of elongation and therefore involve more ohmic loss and poorer coupling; the radiation impedance also increases, though not as drastically, as $n$ increases over this region, increasing gradually from about 75$\Omega$ for antenna length of $\lambda/2$ until it reaches a stable value of about 130$\Omega$.

The solid diode arrays formed by microelectronic techniques are also advantageously provided in two and even three-dimensional arrays, with further benefit of improved coupling. Preferred embodiments of these are shown in the drawings using the symbol of FIG. 11 to denote a single printed diode, with the tunneling region denoted by the circle.

As has been noted, the printed diodes are also effective to generate currents or voltages in response to incident radiation which can be used for other purposes, as for detecting the presence of incident radiant energy or rectifying or converting such energy to electrical power. In such applications the basic considerations for designing the arrays for detecting or converting are the same as those for generating radiation.

Figure 12:
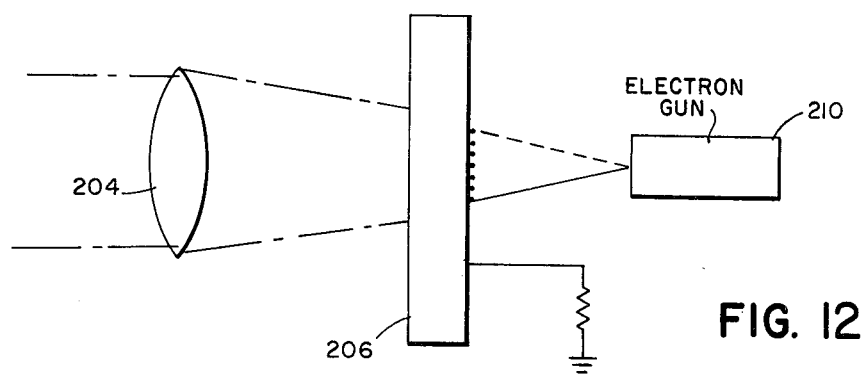
FIG. 12 is a schematic view of an imaging or similar device incorporating the diode system of the invention.
Figure 13:
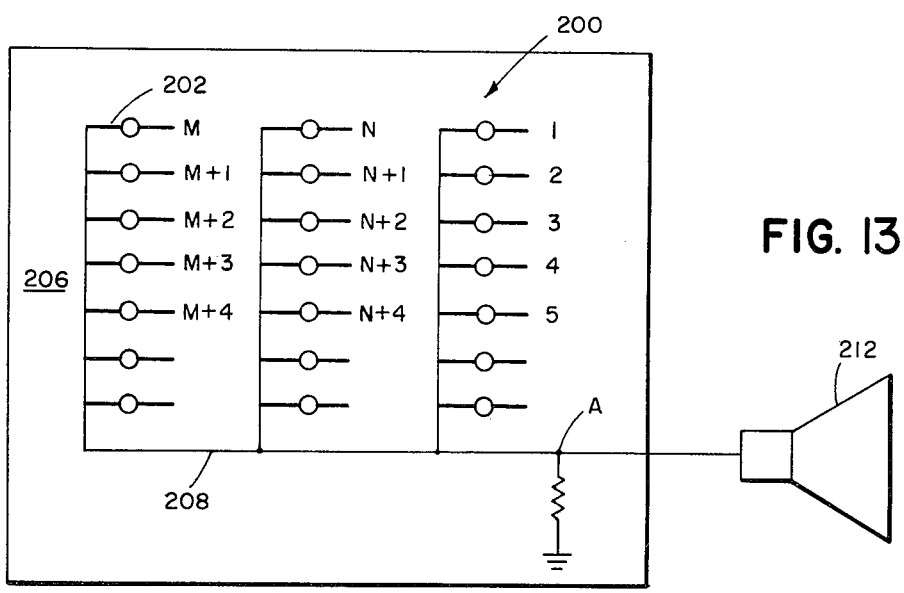
FIG. 13 is a highly magnified, diagrammatic plan view of the array of devices employed in FIG. 12.

Referring to FIGS. 12 and 13 an imaging system is shown in which the light pick up device for the image comprises an array 200 of the printed diodes 202, the diodes sized for response to the wave length of an image projected through lens 204 upon a transparent plate 206. The array is shown disposed on the back side of the plate, with a diode distribution density corresponding to the resolution desired, the antenna of each diode being exposed to light rays of a corresponding picture element of the image, the rays reaching the diode through the transparent substance of the plate 206. For instance if the rays forming the image are of a wave length of 10 $\mu$, the substance of plate 206 may be silicon, which is transparent to that radiation.

Depending upon the amount of radiation present at a give picture element at a given instant, the diode corresponding to the element will produce a rectified voltage across the diodes. All of the diodes are connectd through conductor 208 to common point A. By a raster scan of electron gun 210, the array is scanned and the instantaneous rectified voltage of each diode is read. This is accomplished by the electron beam being focused on the end of the antenna of the respective diode, at points indicated by the numerals in FIG. 13: 1, 2, 3 ... $n, n+1, n+2 ..., m, m+1, m+2$ ... At the instant the beam is focused on a given diode, the current passing through the diode junction and reaching commmon point A is indicative of the rectified voltage hence the intensity of the radiation then incident on the respective diode. The series of voltages produced in each of a succession of raster scans may be recorded in numerous ways, to record the succession of images; television tube 212 is here shown displaying the resultant image, the respective signals from point A controlling the blanking device for the T.V. electron gun, the gun being synchronized in its raster scan with the scan of read-out gun 210.

Figure 14:
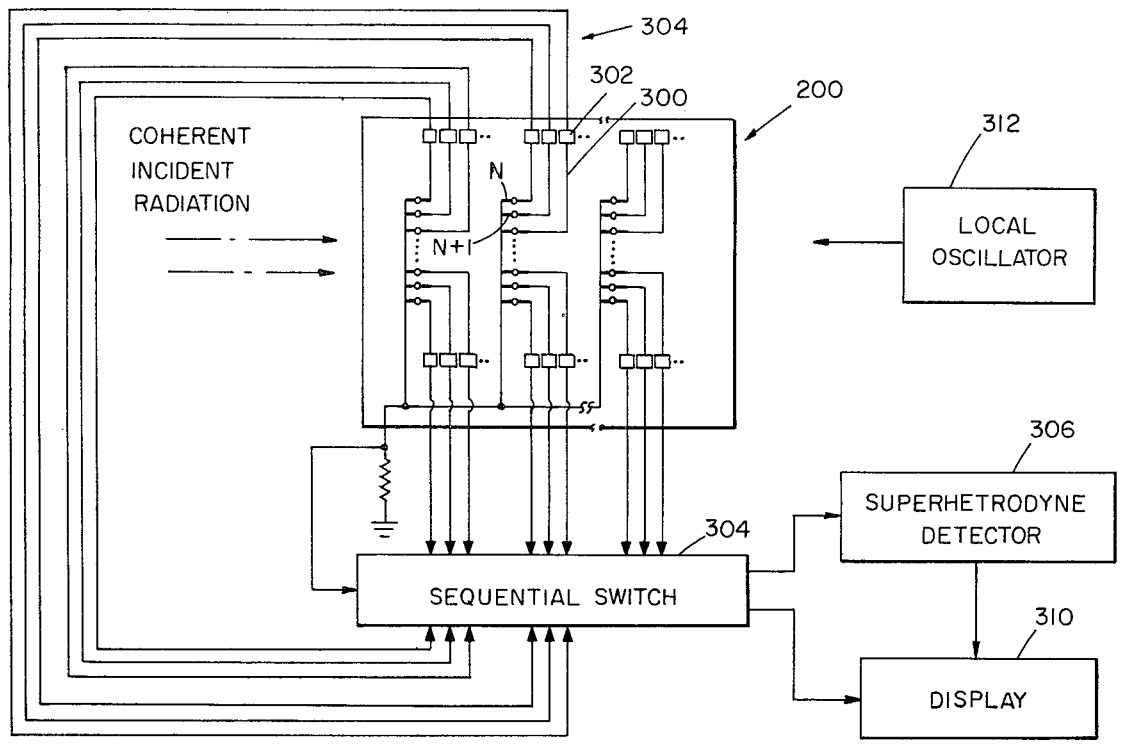
FIG. 14 is a diagrammatic view of an image scanning system employing direct reading of the voltages at the junctions and employing superheterodyne detection.

Referring to FIG. 14 instead of employing an electron beam for read-out of the image, an alternative method is to bring a lead 300 from each individual diode indicated by ... N, N+1 ... in the array 200 to pad terminals 302 at a convenient location. The voltage signal across each pad can then be read and displayed on a T.V. screen 310 successively using appropriate electronic circuitry 304, 306.

In the case of receiving coherent radiation upon the image-responsive array 200 per FIG. 14 a local oscillator signal from source 312 can also be applied for the purpose of detecting each picture element by superheterodyning detector 306 with gain in sensitivity. Also, referring to FIG. 15 in the case e.g., of receiving back a laser reflection from a local source, it is similarly possible also to read-out the phase relation of the returning signal relative to the local source to permit display of the image holographically using both the phase and signal strength information.

Figure 15:
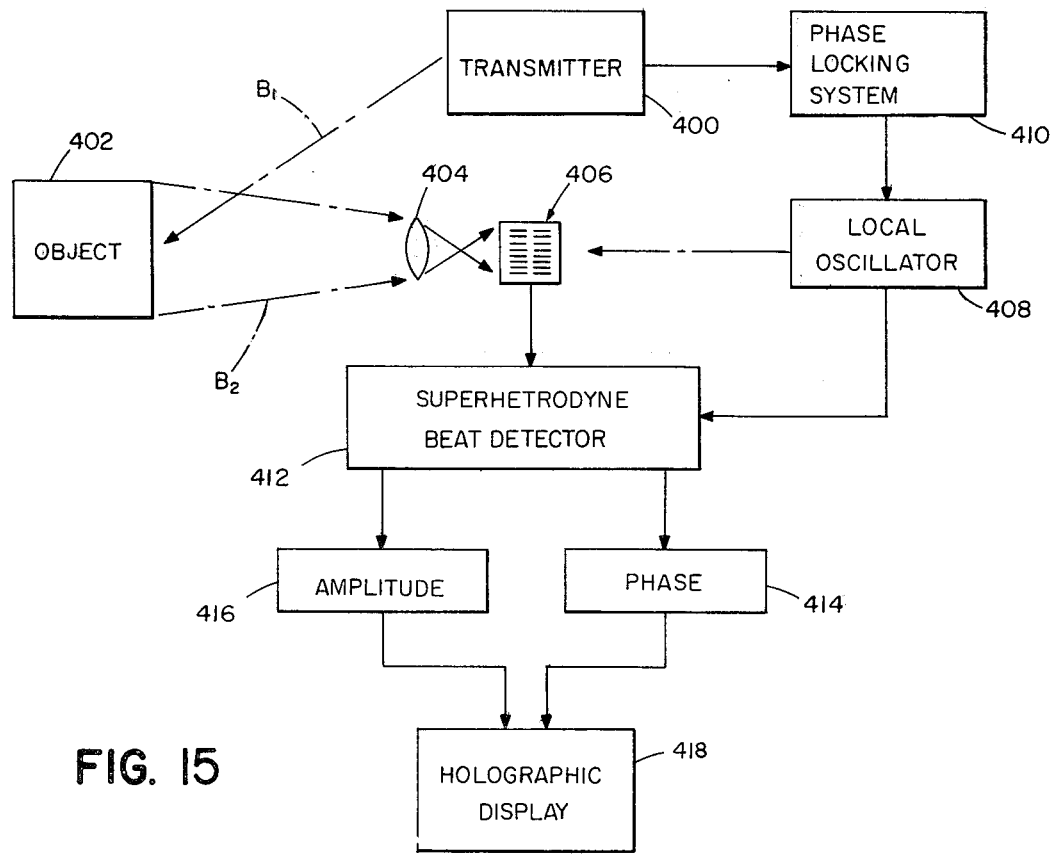
FIG. 15 is a view similar to FIG. 14 of a holographic imaging system.

In FIG. 15 transmitter 400 such as a laser transmits a coherent optical beam $B_1$ which illuminates object 402. The reflected rays $B_2$ are gathered by lens 404 and applied to an array 406 of junctions constructed as above for dissecting the image into a matrix of image elements. Also applied to the array is a beam of coherent radiation from local oscillator 408 of frequency selected to produce superheterodyne beats with the reflected radiation $B_2$. In this case the frequency of the local oscillator 408 is phase locked to the frequency of the transmitted beam $B_1$ by phase locking system 410.

As above, in a repeating pattern, each junction is read by superheterodyne beat detector 412 in this case having a section which produces phase information 414 of the beam incident upon each image element junction relative to the transmitted beam, and also amplitude information 416. Both phase and amplitude information are fed to operate holographic display 418 according to known principles by which a holographic representation of the object 402 is obtained.

As a specific example of forming the solid devices, one may begin with a dielectric substrate such as saphire, transparent to the radiation of interest. The surface is coated with a film of organic polymer such as AZ 1350 resist from Shipley Co., Newton, Massachusetts, a coating which de-polymerizes upon exposure to light. The coating may be for instance from 5,000 to 20,000 A thick.

By computer suitable exposure masks are generated for the first and second metal deposits. The organic coating is exposed to light through the first mask, exposing those lines desired and the resultant depolymerized coating is washed away leaving a relief pattern for the first metal deposit. Thereupon metal is evaporated in vacuum over the entire crystal, the metal at the pattern adhering to the crystal, otherwise to the coating. The coating is then washed away as by acetone. Thereupon the dielectric layer is formed as by exposing a tungsten first metal to the atmosphere. The procedure is then repeated for the second mask, being careful to use alignment markings also generated with the first mask, for ensuring alignment of the second mask, thereby to obtain the proper amount of overlap. These or other such known techniques may be employed in forming the diodes according to this aspect of the invention.

I claim:

1. An imaging system employing an array of devices, each of said devices being an electronic device responsive to optical radiation incident thereupon to generate an electrical effect dependent upon the said incident radiation, and comprising a solid non-metallic substrate, a solid metal deposit thereon, a solid dielectric layer upon a portion of said metal deposit, and a second solid metal deposit on said substrate, said second metal deposit having a limited common area with said first metal deposit the respective common portions of said metal deposits being in intimate contact with opposite sides of and separated by said dielectric layer, said dielectric layer being of limited thickness said common region thereby defining a metal to metal junction, a portion of one of said metal deposits extending away from said junction having a width related to the wave length of said optica radiation and forming an antenna responsive to said incident radiation to generate an alternating electrical current at the frequency of said radiation and to conduct said current to said junction, said junction having a non-linear current-voltage characteristic with respect to said current whereby said current and said junction can interact to produce said electrical effect, said devices distributed to resolve an area upon which radiation is incident, each of said devices effective, upon incidence of radiation thereon, to produce a voltage across its junction, and means to read out said voltages in a repeated fashion.

2. The imaging system of claim 1 wherein said devices are all connected to a common terminal, and including an electron beam scanner for scanning successively said devices, and means responsive to signals on said common terminal to produce a display in synchronism with said scan.

3. The imaging system of claim 2 wherein said devices are deposited upon a dielectric substrate transparent to the radiation of interest, said radiation incident upon said device by passing through said substrate, the devices in said substrate being exposable directly to said electron beam.

4. The imaging system of claim 1 including means for reading the voltages across said junctions directly.

5. The imaging system of claim 1 including means for applying a radiation signal from a local oscillator to each junction, and superhetrodyne means for detecting the beat signals provided by the interaction of said local oscillator signal and said incident radiation.

6. The imaging system of claim 5 including coherent illuminating means for an object, said incident radiation comprising reflection from said object of said coherent illumination, means to apply to said junctions as said local oscillator radiation locked in phase to said illuminating means, means for detecting the phase of the resultant beat notes at said junctions and a holographic display means connected in circuit with said imaging system for representing the image of said object based upon the detected values of amplitude and phase of said beat notes.

7. A holographic imaging system comprising an array of photo-responsive elements arranged to receive thereupon an image reflected from an object illuminated by a coherent beam from a transmitter, means to apply also to said array a beam from a local oscillator at a frequency which is phase-locked to the frequency of said coherent beam thereby to produce at each photo-responsive element a beat frequency arising from mixing of said reflected beam and local oscillator beam, each photo-responsive element having a non-linear current-voltage characteristic and a speed of response to enable development of a signal across each element at said beat frequency, means to detect the amplitude and the phase of the beat signal at each of said photo-responsive elements, and a holographic display connected to be responsive to said amplitude and phase information to produce a holographic image.

* * * * *

UNITED STATES PATENT AND TRADEMARK OFFICE
CERTIFICATE OF CORRECTION

PATENT NO. : 3,947,630
DATED : March 30, 1976
INVENTOR(S) : ALI JAVAN

It is certified that error appears in the above-identified patent and that said Letters Patent are hereby corrected as shown below:

After the "Abstract" insert the following paragraph:

---The Government has rights in this invention pursuant to Contract No. F19628-70-C-0150 awarded by the Electronics Systems Division of the Department of the Air Force, and to Contract No. N00014-67-A-0204-0014 awarded by the Office of Naval Research, Department of the Navy.---

Signed and Sealed this

Nineteenth Day of February 1980

[SEAL]

Attest:

SIDNEY A. DIAMOND

Attesting Officer

Commissioner of Patents and Trademarks